United States Patent [19]
Thaler et al.

[11] Patent Number: 5,847,935
[45] Date of Patent: Dec. 8, 1998

[54] ELECTRONIC CIRCUIT CHIP PACKAGE

[75] Inventors: Barry Jay Thaler, Lawrenceville; Ashok Narayan Prabhu, East Windsor, both of N.J.; Ananda Hosakere Kumar, Milpitas, Calif.; Bernard Dov Geller, Princeton, N.J.

[73] Assignee: Sarnoff Corporation, Princeton, N.J.

[21] Appl. No.: 768,062

[22] Filed: Dec. 16, 1996

[51] Int. Cl.⁶ ..................................... H05K 01/14
[52] U.S. Cl. .......................... 361/761; 361/748; 361/751; 361/762; 361/764; 361/767; 361/760; 361/772; 361/777; 361/783; 361/807; 361/820; 257/700; 257/710; 257/778; 257/782; 257/784; 257/773; 257/774; 257/713; 174/255; 174/261; 174/266
[58] Field of Search ..................................... 361/761, 748, 361/751, 762, 764, 767, 760, 772, 773, 777, 783, 803, 807, 820; 257/710, 700, 718, 778, 782, 784, 773, 774, 776, 775, 738, 739, 781, 772, 713; 174/255, 261, 266

[56] References Cited

U.S. PATENT DOCUMENTS

| | | | |
|---|---|---|---|
| 5,008,734 | 4/1991 | Dutta et al. | 257/693 |
| 5,354,599 | 10/1994 | McClanahan et al. | 428/209 |
| 5,557,502 | 9/1996 | Banerjee et al. | 361/712 |
| 5,583,378 | 12/1996 | Marrs et al. | 257/710 |

*Primary Examiner*—Leo P. Picard
*Assistant Examiner*—David Foster
*Attorney, Agent, or Firm*—William J. Burke

[57] ABSTRACT

A package for an electronic component includes a metal base plate and a body of an insulating material, such as glass or ceramic, on and bonded to a surface of the base plate. The body is formed of a plurality of layers of the insulating material stacked and bonded to each other and has at least one opening extending therethrough to the base plate. Strips of a conductive material, such as a metal, are on the surface of various layers of the body. An electronic component is mounted in the opening in the body and has terminals which are electrically connected to the conductive strips on the body, preferably by wires. Vias of a conductive material may extend through some of the layers of the body to connect the conductive strips to terminals on the surface of the body. A cover plate of an insulating material may extend over the body and the opening therein to enclose the electronic component in the body.

14 Claims, 2 Drawing Sheets

ELECTRONIC CIRCUIT CHIP PACKAGE

The present invention relates to a package for at least one electronic circuit chip, and, more particularly, to a package for an electronic circuit chip having a large number of output terminals and which is relatively small and compact.

BACKGROUND OF THE INVENTION

The present tendency is to forming electronic circuits which include a large number of electronic components therein. Also, assemblies are being made of a plurality of such electronic circuit chips. Increasing the number of electronic components in the chip to make the circuit larger and more complex also increases the number of input/output terminals required for the circuit assembly. Thus, the package for such electronic circuit chips must be able to provide a larger number of output terminals. However, it is also desirable to make the package for such electronic circuit chips relatively small in size and compact and have good thermal dissipation properties. In addition, there has been developed electronic circuit chips which can include high frequency RF, analog and digital systems, all in a single assembly. For such assemblies it is necessary to have a package which can accommodate RF, analog and digital systems.

SUMMARY OF THE INVENTION

A package of an electronic component includes a base plate of a electrically and/or thermally conductive material having a surface. A body of an insulating material is on the surface of the base plate. The body includes a plurality of layers of the insulating material bonded together and to the base plate. A plurality of conductive strips are on the surface of at least some of the layers of the body. There is at least one opening through the body to the base plate. An electronic component is in the opening in the body and is seated on the base plate. Means are provided to electrically connect the electronic component to the conductive strips on the body.

DETAILED DESCRIPTION

Figure 1:
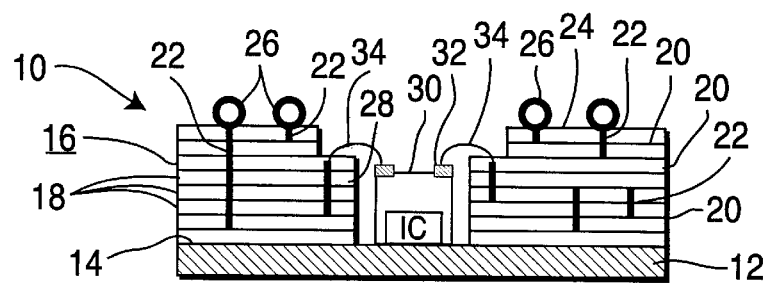
FIG. 1 is a sectional view of one form of the electronic circuit chip package in accordance with the present invention.
Figure 2:
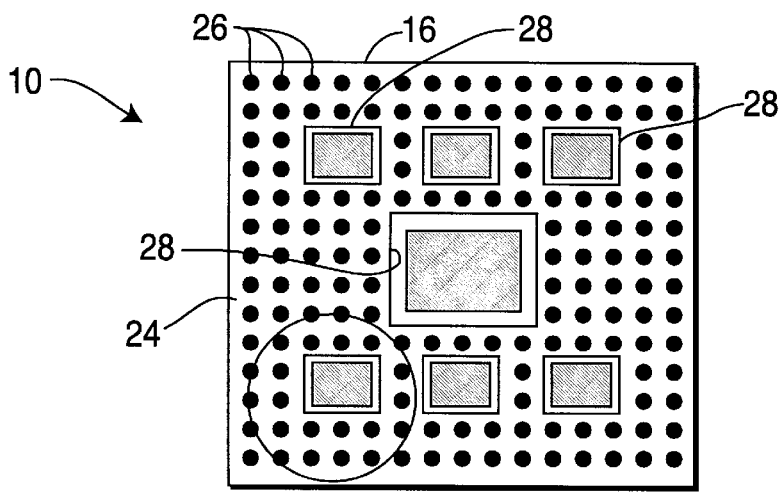
FIG. 2 is a top plan view of the package shown in FIG. 1.

Referring initially to FIGS. 1 and 2, an electronic circuit package of the present invention is generally designated as 10. Package 10 comprises a base plate 12 of a thermally conductive material, such as a metal, having on a surface 14 thereof a body 16 of an electrically insulating material, such as a glass or ceramic. The body 16 is formed of a plurality of layers 18 of the electrically insulating material stacked on each other and bonded together. On the surface of each of the layers 18 is a layer 20 of an electrically conductive material, such as a metal. Each of the conductive layers 20 may cover the entire area or a portion of the surface if its respective insulating layer 18. Also, the conductive layers 20 may be in the form of a pattern of strips which form circuit interconnections.

A plurality of vias 22 of an electrically conductive material, such as a metal, extend through the body 16 or a portion of the body 16. As shown in FIG. 1, some of the vias 22 extend from the top surface 24 of the body 16. The vias 22 extend through a different number of the insulating layers 18 to make electrical contact to the conductive layers 20 on the surface of various ones of the insulating layers 18. Some of the vias 22 extend through only intermediate insulating layers 18 to electrically connect the conductive layers 20 on these intermediate insulating layers 18. The vias 22 which extend to the top surface 24 of the body 16 have terminal bumps 26 of an electrically conductive material, such as a metal, thereon. As shown in FIG. 2, the terminal bumps 26 may be arranged in a grid pattern of rows and columns on the top surface 24 of the body 16. Thus, the vias 22 electrically connect the various conductive layers 20 to each other and to the terminal bumps 26 on the top surface 24 of the body 16.

The body 16 has at least one opening 28 extending therethrough to the base plate 12. As shown in FIG. 2, there are a plurality of the openings 28 in the body 16. In each of the openings 28 and seated on the surface 14 of the base plate 12 is an electronic circuit component 30, such as an integrated circuit. As shown in FIG. 1, the electronic circuit component 30 has terminals 32 which are electrically connected to either a via 22 or to a conductive layer 18 by wires 34. Thus, the electronic circuit components 30 are electrically connected to the conductive layers 18 which electrically connect the various electronic circuit components 30 together in a desired circuit having the terminal bumps 26 as the output and input terminals for the circuit.

In the package 10, the electronic circuit components 30 are all encased within the body 16 so as to form a compact package which is relatively small in size. The metal base plate 12 serves as a heat spreader so as to maintain the electronic circuit components 30 at a relatively low temperature during their operation. Since all of the terminals of the package 10, the terminal bumps 26, are on the top surface 24 of the body 16, the package 10 can be placed upside down on a printed circuit board to electrically connect the circuit formed in the package 10 to the conductors on the board. Also, various types of electronic circuit components 30, such as RF, analog, and digital systems, may be mounted in the openings 28 in the body 16 to form a desired circuit. The various types of electronic circuit components 30 would be insulated from each other by the insulating body 16. In addition, some of the electrically conductive layers 18 may be used as ground planes for the electronic circuit components 30.

The package 10 may be made by first forming the layers which form the body. The layers are formed by mixing together particles of a glass with a liquid vehicle and a binder. The mixture is then spread on a flat surface to form a layer of the mixture of the desired thickness. The layer is allowed to dry to form a green tape of the glass particles in the binder. A plurality of the green tapes are formed. Openings or holes can be formed in the green tapes by punching or cutting to provide for the openings 28 and the holes for the vias 22. A layer of an electrically conductive material is then coated on the surface of each of the green tapes to form the electrically conductive layers 20. The green tapes are then stacked on each other and on the surface 14 of a base plate 12. The assembly is then fired at a temperature which drives off the binder and melts the glass particles. When cooled, there is provided a body 16 of the electrically insulating material bonded to the base plate 12. The temperature at which the green tapes are fired can be such as to merely melt the glass particles so that when cooled the body 16 is of a glass, or can be at a temperature at which the glass particles devitrify so that the resulting body 16 is of a ceramic. The holes for the vias 22 can then be filled with a metal and bumps formed on the top surface 24 of the body 16 over each of the vias 22. The electronic components 30 can then be mounted in the openings 28 and wired to the vias 22 or the conductive layers 20.

Figure 3:
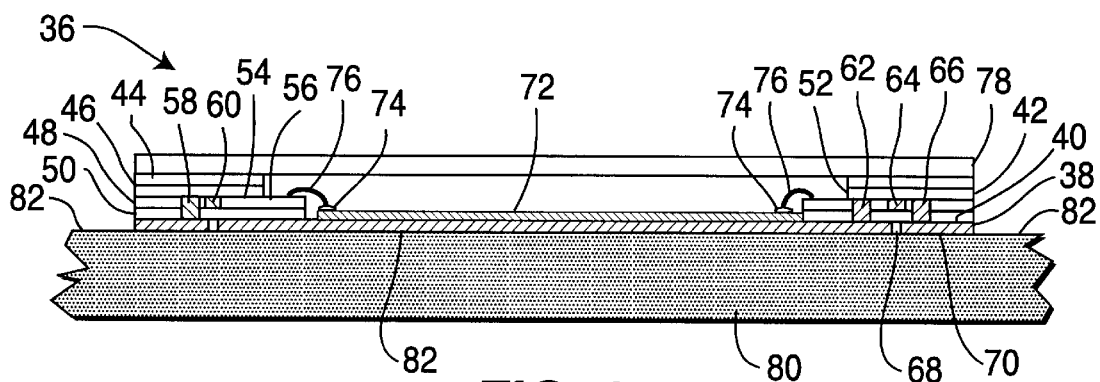
FIG. 3 is a sectional view of a second form of the electronic circuit chip package in accordance with the present invention.

Referring now to FIG. 3, a second form of the electronic circuit package in accordance with the present invention is generally designated as 36. Package 36 comprises a base plate 38 of a conductive material, such as a metal, having on a surface 40 thereof a body 42 of an electrical insulating material, such as a glass or ceramic. The body 42 is made of a plurality of layers 44, 46, 48 and 50 of the insulating material stacked on each other and bonded together. The body 42 has a central opening 52 therethrough to the base plate 38. The portion of the opening 52 through the top layers 44 and 46 is larger than the portion of the opening 52 through the bottom two layers 48 and 50 so that a portion of the surface of the layer 48 is exposed around the edge of the opening 52.

A plurality of strips 54 of a conductive material, such as a metal, are on the surface of the layer 48 and extend over the surface of the layer 48 from the edge of the opening 52. Strips 56 of a conductive material, such as a metal, are also on the surface of the layer 50. Vias 58, 60, 62, 64 and 66 of a conductive material, such as a metal, extend through the bottom layers 48 and 50. As shown, the vias 58, 62 and 66 extend through both of the layers 48 and 50 to connect the various metal strips 54 on the layer 48 to the base plate 38, and the vias 60 and 64 extend only through the layer 48 to connect the various strips 54 on the layer 48 to the strips 56 on the layer 50. The base plate 38 has a recess 68 therethrough so as to divide the peripheral portion of the base plate 38 into a plurality of separate terminal portions 70. Some of the vias extend to the base plate 38 while other of the vias extend to the terminal portions 70 of the base plate 38.

An electronic component 72, such as an integrated circuit, is mounted in the opening 52 in the body 42 and is seated on the base plate 38. The electronic component 72 has a plurality of terminals 74 which are electrically connected to the strips 54 on the layer 48 of the body 42 by terminal wires 76. Thus, the electronic component 72 is electrically connected to the base plate 38 and the terminal portions 70 of the base plate 38 through the wires 76, strips and vias. A cover plate 78 of an electrical insulating material, such as a glass or ceramic, extends over the top surface of the body 42 and over the opening 52 and is secured to the body 42 by a suitable bonding material. Thus, the cover plate 78 encloses the electronic component 72 in the package 36. As shown in FIG. 3, the package 36 may be mounted on a printed circuit board 80 with the base plate 38 and the terminal portions 70 being seated on and electrically connected to conductive strips 82 on the board 80.

The package 36 is made in the same manner as previously described with regard to the package 10 shown in FIGS. 1 and 2. The body 42 is formed of a plurality of green tapes which have been cut to form the opening 52 and which have conductive strips thereon. The green tapes are stacked on each other and on the base plate 38 and then fired at a temperature at which the glass particles in the green tapes melt. When cooled, the glass bonds together and to the base plate 38 to form the package 36.

Figure 4:
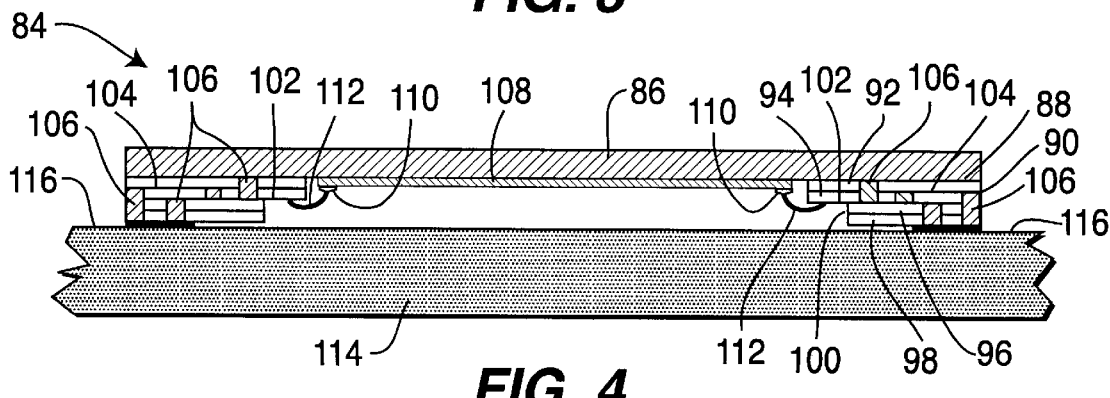
FIG. 4 is a sectional view of a third form of the electronic circuit chip package in accordance with the present invention.

Referring now to FIG. 4, a third form of the electronic component package of the present invention is generally designated as 84. Package 84 is similar to the package 36 shown in FIG. 3 in that it comprises a base plate 86 of a conductive material, such as a metal, having on a surface 88 thereof a body 90 of an electrical insulating material, such as a glass or ceramic. The body 90 is formed of a plurality of layers 92, 94, 96 and 98 which are in stacked relation and bonded together. The body 90 has a central opening 100 therethrough to the base plate 86. The portion of the opening 100 through the layers 96 and 98 is larger than the portion of the opening 100 through the layers 92 and 94 so that a portion of the surface of the layer 94 adjacent the opening 100 is exposed.

A plurality of strips 102 of a conductive material, such as a metal, are on the surface of the layer 94 and extend from the edge of the opening 100. A plurality of strips 104 of a conductive material, such as a metal, are on the surface of the layer 92. Vias 106 of a conductive material, such as a metal, extend through the layers of the body 90. Some of the vias 106 extend through the layers 92 and 94 between the conductive strips 102 on the layer 94 and the base plate 86. Some of the vias 106 extend only through the layer 94 between the conductive strips 102 on the layer 94 and the conductive strips 104 on the layer 92. Some of the vias 106 extend through the layers 96 and 98 between the conductive strips 102 on the layer 94 and the top surface of the body 90, and some of the vias 106 extend through the layers 94, 96 and 98 between the conductive strips 104 on the layer 92 and the top surface of the body 90.

An electronic component 108, such as an integrated circuit, is within the opening 100 in the body 90 and is seated on the base plate 86. The electronic component 108 has a plurality of terminals 110 which are electrically connected to the various strips 102 on the layer 94 of the body 90 by terminal wires 112. A protective coating may be applied over the chip. Thus, the electronic component 108 is electrically connected to the base plate 86 and to the top surface of the body 90 by the terminal wires 112, conductive strips 102 and 104 and the vias 106. As shown in FIG. 4, the package 84 is mounted on a printed circuit board 114 with the top surface of the body 90 being seated on the board 114. The vias 106 which extend to the top surface of the body 90 are seated on and electrically connected to conductive strips 116 on the board 114. The package 84 is made in the same manner as described above with regard to the package 36 shown in FIG. 3.

Figure 5:
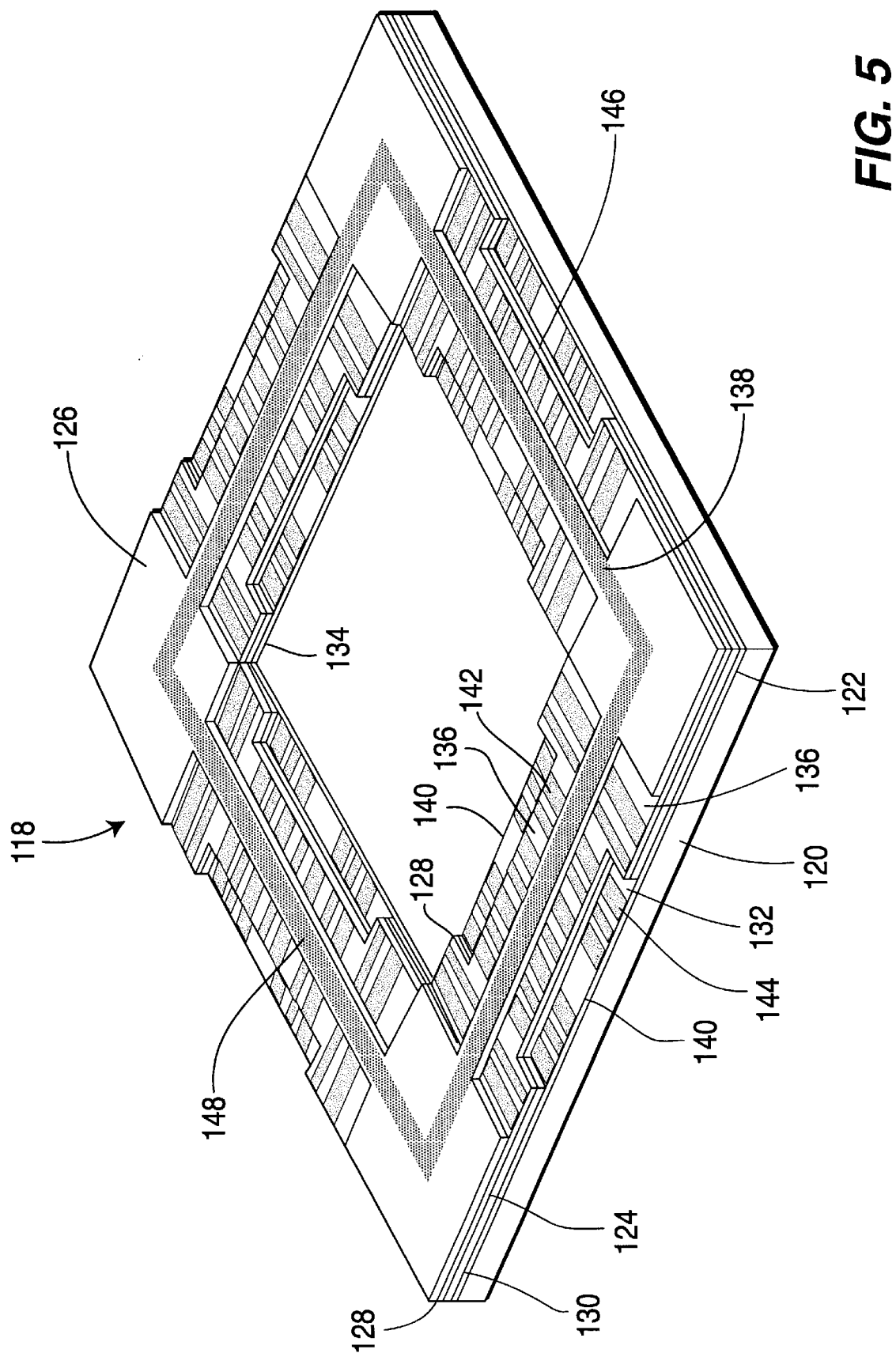
FIG. 5 is a perspective view of the bottom portion of a fourth form of the electronic circuit chip package in accordance with the present invention.

Referring now to FIG. 5, a fourth form of the electronic circuit package of the present invention is generally designated as 118. Package 118 comprises a base plate 120 of a thermally conductive material, such as a metal, having on a surface 122 thereof a body 124 of an electrically insulating material, such as a glass or ceramic. The body 124 is formed of a plurality of layers of the insulating material. As shown, the body 124 is formed of four layers 126, 128, 130 and 132. The body 124 has a large central opening 134 therethrough to the base plate 120. As shown, the base plate 120, body 124 and opening 134 are rectangular in shape so that the body 124 is in the form of a rectangular frame. However, the body 124 can be of any desired shape.

As shown in FIG. 5, at each side of the body 124, the top layer 126 is cut away to expose a portion 136 of the next layer 128 at both the outer edge of the body 124 and along the edge of the open 134. A strip 138 of the top layer 126 extends between the two cut away portions 136. Likewise, a portion of each of the next two layers 128 and 130 are cut away to expose a portion 140 of the bottom layer 132 at both the outer edge of the body 124 and along the edge of the opening 134. A plurality of spaced, parallel terminal strips 142 are on the exposed portions 136 of the layer 128 and extend across the layer 128 between the outer edge of the body 124 and the edge of the opening 134. A plurality of spaced, parallel terminal strips 144 are on the exposed portions 140 of the layer 132 and extend across the layer 132 between the outer edge of the body 124 and the edge of the opening 134. The terminal strips 142 and 144 are of an electrically conductive material, such as a metal. The layer 130 of the body 42 has on the surface thereof a layer 146 of a conductive material, such as metal. A metal strip 148 is on the surface of the top layer 132 and extends in an enclosed configuration over the strips 138 of the top layer 132.

An electronic component (not shown) such as an integrated circuit, is mounted within the opening 134 and is seated on the base plate 120 in the same manner as shown in the packages of FIGS. 1, 3 and 4. The electronic component has a plurality of terminals thereon which are positioned around the edge of the component. The terminals of the electronic component are electrically connected to various ones of the terminal strips 142 and 144 at the inner edge of the opening 134 by wires. A cover plate, not shown but similar to the cover plate 78 of the package 36 shown in FIG. 3, of an electrical insulating material, such as a glass or ceramic, can extend over the top surface of the body 124 and over the opening 134 to enclose the electronic component 150 within the package 118. The cover plate can be secured to the body 124 with a suitable bonding material. The package 118 is made from a plurality of green tapes in the same manner as previously described with regard to the package 10 shown in FIG. 1.

Thus there is provided by the present invention a package for an electronic component which has a plurality of terminals so that it can contain an electronic circuit which is relatively complex and which has a plurality of terminals. The package contains at least one opening therein which receives the electronic component so that the electronic component is protected. However, the package is relatively small, compact and sturdy. Although each of the forms of the package is shown as having its insulating body made up of a specific number of layers, it should be understood that each of the packages can be formed of any desired number of layers.

What is claimed is:

1. An electronic component package comprising:
   a base plate of a conductive material;
   a body of an insulating material on a surface of said base plate, said body formed of a plurality of layers of glass or ceramic bonded together and to said base plate;
   a plurality of conductive strips on the surface of at least some of the layers of the body;
   at least one opening in said body extending to said base plate;
   an electronic component in said opening in said body and seated on the base plate; and
   means electrically connecting the electronic component to the conductive strips.

2. An electronic component package in accordance with claim 1 in which the electronic component has terminals and conductive wires extend between the terminals of the electronic component and the conductive strips to electrically connect the electronic component to the conductive strips.

3. An electronic component package in accordance with claim 1 in which the body has a surface and a plurality of vias of a conductive material extend at least partially through the body from the surface, each of said vias extending to an contacting a conductive strip on the surface of a layer of the body.

4. An electronic component package in accordance with claim 3 including a separate terminal bump of a conductive material on the surface of the body and in contact with each of the vias.

5. An electronic component package in accordance with claim 4 in which the vias and the terminal bumps are arranged in a pattern of rows and columns.

6. An electronic component package in accordance with claim 4 including a plurality of spaced openings through said body to said base plate, a separate electronic component in each of said openings and seated on the base plate, and means electrically connecting each of the electronic components to the conductive strips on the layers of the body.

7. An electronic component package in accordance with claim 6 in which each of the electronic components has terminals and conductive wires extend between the terminals of the electronic components and the conductive strips to electrically connect the electronic components to the conductive strips.

8. An electronic component package in accordance with claim 1 in which the opening in the body forms the body into a frame having sides which have inner and outer edges, and the conductive strips extend across the sides of the frame between the inner edge and the outer edge of the sides.

9. An electronic component package in accordance with claim 8 in which the top layer of the body is removed along portions of the sides of the top layer from the inner and outer edges to expose portions of a second layer of the body beneath the top layer and portions of the conductive strips on the second layer at the inner and outer edges of the sides, and the electronic component is electrically connected to the portions of at least some of the conductive strips at the inner edge of the sides.

10. An electronic component package in accordance with claim 9 in which portions of the exposed portions of the second layer are removed to expose portions of a third layer beneath the second layer and portions of the conductive strips on the third layer at the inner and outer edges of the body, and the electronic component is electrically connected to the portions of at least some of the conductive strips on the third layer at the inner edge of the sides of the body.

11. An electronic component package in accordance with claim 10 including a layer of a conductive material on a conductive material on a major portion of the surface of one of the layers of the body.

12. An electronic component package in accordance with claim 10 including a metal bonding strip extending in an enclosed path around the top surface of the body.

13. An electronic component package in accordance with claim 12 including a cover plate of an insulating material extending over the top surface of the body and the opening in the body and secured to the top surface of the body.

14. An electronic component package in accordance with claim 13 in which the electronic component has terminals and wires electrically connect the terminals of the electronic component to the conductive strips on the body.

* * * * *